United States Patent
Bryson

(10) Patent No.: US 7,538,583 B2
(45) Date of Patent: *May 26, 2009

(54) HIGH VOLTAGE INTEGRATED CIRCUIT DRIVER WITH A HIGH VOLTAGE PMOS BOOTSTRAP DIODE EMULATOR

(75) Inventor: Stephen W. Bryson, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/517,629

(22) Filed: Sep. 8, 2006

(65) Prior Publication Data

US 2007/0008010 A1 Jan. 11, 2007

Related U.S. Application Data

(63) Continuation of application No. 10/895,568, filed on Jul. 21, 2004, now Pat. No. 7,106,105.

(51) Int. Cl.
*H03K 19/094* (2006.01)
*H03K 19/0175* (2006.01)
*H03L 7/06* (2006.01)

(52) U.S. Cl. .............................. 326/88; 326/83; 326/87; 327/159

(58) Field of Classification Search ........................ None
See application file for complete search history.

(56) References Cited

U.S. PATENT DOCUMENTS

| | | | |
|---|---|---|---|
| 4,281,905 A | | 8/1981 | Harvey et al. |
| 4,908,551 A | | 3/1990 | Ludikhuize et al. |
| 5,373,435 A | * | 12/1994 | Jayaraman et al. ............ 363/98 |
| 5,408,150 A | * | 4/1995 | Wilcox ........................ 327/108 |
| 5,502,632 A | | 3/1996 | Warmerdam et al. |
| 5,543,740 A | * | 8/1996 | Wong ......................... 327/108 |
| 5,666,280 A | | 9/1997 | Janaswamy et al. |
| 6,353,345 B1 | * | 3/2002 | Yushan et al. ............... 327/112 |
| 6,825,700 B2 | * | 11/2004 | Hano ......................... 327/108 |
| 6,859,087 B2 | * | 2/2005 | Galli et al. .................. 327/423 |
| 7,106,105 B2 | * | 9/2006 | Bryson ........................ 326/88 |

* cited by examiner

*Primary Examiner*—Rexford Barnie
*Assistant Examiner*—Dylan White
(74) *Attorney, Agent, or Firm*—Sidley Austin LLP

(57) ABSTRACT

A high voltage circuit driver includes high and low side driver cells to drive a high and a low side power MOSFET, a bootstrap circuit to energize the high side driver cell, a high voltage PMOS transistor (HVPMOS) between a voltage source and the bootstrap circuit, wherein the HVPMOS is embedded in an N-isolation layer and is integrated with the driver cells. A bootstrap control circuit, for controlling the HVPMOS, includes a high voltage level shift stage, which can also be embedded in an N-isolation layer. The circuit driver is operated by switching the high side drive signal from high to low, the low side drive signal from low to high with a first delay, and a bootstrap control signal from high to low with an additional second delay. Also, the bootstrap capacitor is first charged by switching on the HVPMOS, and then it energizes the high side driver cell.

17 Claims, 3 Drawing Sheets

HIGH VOLTAGE INTEGRATED CIRCUIT DRIVER WITH A HIGH VOLTAGE PMOS BOOTSTRAP DIODE EMULATOR

CROSS REFERENCE TO RELATED APPLICATION

The present application is a continuation of application Ser. No. 10/895,568, filed Jul. 21, 2004, the entirety of which is incorporated by reference herein.

BACKGROUND

1. Field of Invention

The present invention relates to drivers for DC-to-DC converters and more particularly to high voltage drivers with diode emulators.

2. Description of Related Art

Various DC-to-DC converters and related circuits often use two power MOSFETs, which are connected at an output node in a half-bridge configuration. The output node is connected to an inductor-capacitor filter. Such DC-to-DC converters allow the conversion of variable input battery voltages in a wide range, for example in the range of 6-24V to be stepped down to a lower constant output voltage. When the battery voltage decays from a nominal value of 24V to a value as low as 6V, the output voltage of the DC-to-DC converter remains essentially constant, because of the adaptive adjustments of the converter.

A converter includes a driver circuit, which drives the power MOSFETs. The driver circuit is controlled by a control circuit to turn on the high side power MOSFET and turn off the low side power MOSFET, and then turn on the low side power MOSFET and turn off the high side power MOSFET in an alternating manner. Thus, the control circuit, through the driver circuit, governs the charging and discharging intervals of the inductor-capacitor (LC) filter. The voltage, output by the LC filter, is then used to generate a step-down DC voltage.

In these DC-to-DC converters the high side driver cell, turning on or off the high side power MOSFET, operates at the high voltage set by the battery. Correspondingly, a high voltage has to be supplied to operate the high side driver cell.

In some converters, a bootstrap capacitor is used to supply the high voltage for the high side driver cell. This bootstrap capacitor is coupled between the node connecting the power MOSFETs and the high side driver cell. The bootstrap capacitor is charged up to a separately supplied voltage, for example, 5V, during the period, when the low side driver turns on the low side power MOSFET. Once the low side power MOSFET is turned off and the high side power MOSFET is turned on, the voltage at the node connecting the power MOSFETs flies up to close to the battery voltage, taking with it the voltage of the bottom plate of the bootstrap capacitor. Since the bootstrap capacitor has been charged to about 5V, the voltage of its top plate is then equal to the battery voltage plus 5V, thus well suited to supply the required high voltage for the high side driver cell.

Concerning related existing converter designs, U.S. Pat. No.: 4,908,551 discloses a half-bridge driver circuit, where the high side driver cell is powered by a bootstrap capacitor. However, the bootstrap capacitor is charged by an external high voltage supply. External discrete components increase fabrication cost and the complexity of the circuit. U.S. Pat. Nos. 5,373,435 and 5,502,632 each disclose a half-bridge driver circuit using an N-channel LDMOS transistor, as a bootstrap diode emulator. This circuit uses the drain of the LDMOS transistor to connect to the bootstrap capacitor and requires a substantial amount of extra circuitry to guarantee that the body voltage of the LDMOS transistor is properly biased with respect to the drain and source. Finally, U.S. Pat. No. 5,666,280 discloses a similar half-bridge driver circuit, but with a JFET structure being utilized as the bootstrap diode emulator. This circuit reduces the complexity of the body diode circuitry, however, it considerably increases the process complexity and expense with the introduction a high voltage JFET structure.

SUMMARY

Briefly and generally, embodiments of the invention include a high voltage circuit driver, including a high side driver cell, operable to drive a gate of a high side power MOSFET, a low side driver cell, operable to drive a gate of a low side power MOSFET, a bootstrap circuit, coupled between an output node and a supply-voltage terminal of the high side driver cell, a high voltage PMOS transistor, coupled between a first voltage source terminal and the bootstrap circuit, wherein the high voltage PMOS transistor is embedded in an N-isolation layer and is integrated with the driver cells, a bootstrap control circuit, coupled to the high voltage PMOS transistor, and a high side driver control circuit and a low side driver control circuit, coupled to the high side driver cell and the low side driver cell, respectively.

Embodiments further include a controller for the high voltage circuit driver, including a comparator, a delay element, coupled to the comparator, logic circuitry, a first input of the logic circuitry coupled to the delay element, and a high voltage level shift stage, the output of the logic circuitry coupled into the high voltage level shift stage, the output of the high voltage level shift stage coupled to the high voltage PMOS transistor, wherein the high voltage level shift stage is embedded in an N-isolation layer and is integrated with the driver cells.

Embodiments further include a method of operating a high voltage driver, the method including switching a high side drive signal from high to low, applied to a high side driver cell of a converter, switching a low side drive signal from low to high with a first delay, applied to a low side driver cell of the converter, and switching a bootstrap control signal from high to low with a second delay, applied to a high voltage PMOS transistor, the PMOS transistor being embedded into an N-isolation layer and integrated with the driver cells, wherein the second delay is partially subsequent to the first delay.

Embodiments further include a method of operating a driver controller, the method including switching on a low side power MOSFET, coupled between an output node and a ground, for a first interval, charging a bootstrap capacitor by switching on a high voltage PMOS transistor, the PMOS transistor being coupled between a first voltage source and a first plate of the bootstrap capacitor and embedded into an N-isolation layer, wherein the second plate of the bootstrap capacitor is coupled to the output node, and energizing a high side driver cell by the charged bootstrap capacitor for a second interval, whereby the high side driver cell provides a predetermined voltage to a gate of a high side power MOSFET.

BRIEF DESCRIPTION OF DRAWINGS

For a more complete understanding of the present invention and for further features and advantages, reference is now made to the following description taken in conjunction with the accompanying drawings.

DETAILED DESCRIPTION

Embodiments of the present invention are best understood by referring to FIGS. 1-4 of the drawings. Like numerals are used for like and corresponding parts of the various drawings.

Figure 1:
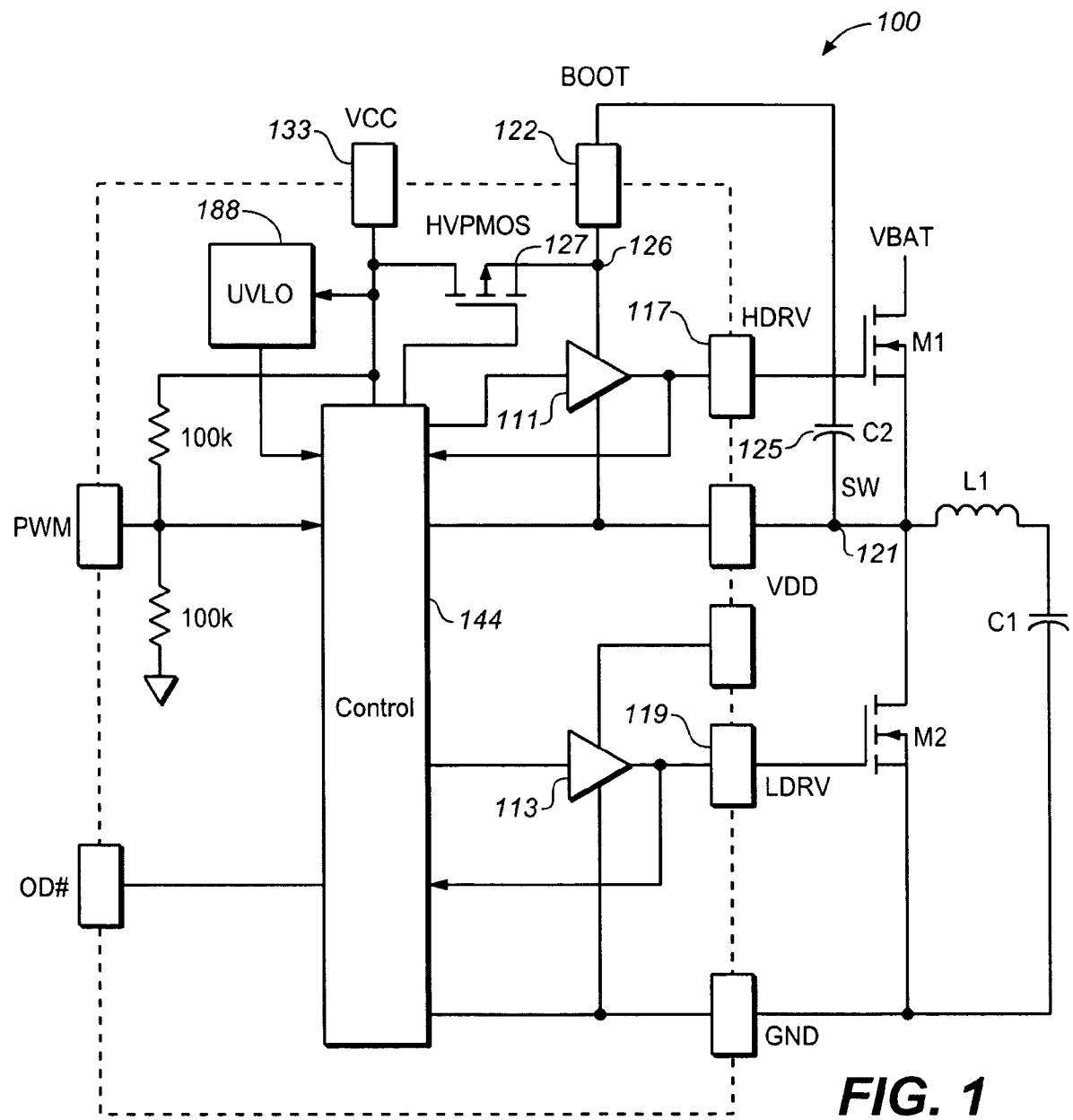
FIG. 1 is a block diagram of a circuit driver, according to an embodiment of the invention.

FIG. 1 illustrates a high voltage circuit driver 100 according to an embodiment of the invention. Circuit driver 100 includes a high side driver cell 111, which can be coupled to a gate of a high side power MOSFET M1, and a low side driver cell 113, which can be coupled to a gate of a low side power MOSFET M2. Power MOSFETs M1 and M2 can be N-channel MOSFETs. In some embodiments, circuit driver 100 is separate from power MOSFETs M1 and M2. In these embodiments, high side driver cell 111 is coupled to high side power MOSFET M1 via high side drive port 117, and low side driver cell 113 is coupled to low side power MOSFET M2 via low side drive port 119. In other embodiments circuit driver 100 and power MOSFETs M1 and M2 are integrated.

High side power MOSFET M1 is coupled between a power supply, providing a voltage VBAT, and an output node 121. Low side power MOSFET M2 is coupled between output node 121 and a ground or power ground.

In some embodiments, circuit driver 100 further includes an inductor-capacitor (LC) filter circuit. LC filter circuit includes inductor L1 and capacitor C1 in series, coupled between output node 121 and a ground.

Driver cells 111 and 113 may include low voltage CMOS transistors or bipolar junction transistors, which use operating voltages in the range of about 2V to 15V. Low side driver cell 113 is coupled to a voltage source, which supplies an operating voltage VDD, which can be, for example, 12V.

In contrast, the high side voltage VBAT can be up to 30V in some applications, such as in laptop computers and other portable consumer electronics products. In these applications, high side driver cell 111 operates at higher voltages, determined by VBAT. In some embodiments, operating at these higher voltages is facilitated by additional circuitry. For example, in some embodiments circuit driver 100 includes a bootstrap circuit 125, which is coupled between output node 121 and a supply-voltage terminal 126 of high side driver cell 111. Bootstrap circuit 125 includes bootstrap capacitor C2. Bootstrap circuit 125 can be separate from circuit driver 100, coupled to it at output node 121 and bootstrap input terminal 122.

Circuit driver 100 further includes high voltage transistor (HVPMOS) 127. High voltage transistor 127 is coupled between a voltage source terminal 133 and bootstrap circuit 125. Voltage source terminal 133 can be coupled to a typical voltage source with an operating voltage VCC in the range of about 2V to 10V, for example 5V. High voltage transistor 127 can be a PMOS transistor, embedded in an N-isolation layer 201 (see below). High voltage transistor 127 can be integrated with the rest of circuit driver 100, avoiding the need of external control diodes for circuit driver 100. In such embodiments, high voltage transistor 127 can be formed with the same mask and manufacturing process as the rest of circuit driver 100.

Circuit driver 100 further includes a bootstrap control circuit 144-1, coupled to high voltage transistor 127, a high side driver control circuit 144-2 and a low side driver control circuit 144-3. In some embodiments any two or all three of these control circuits can be integrated into a single control circuit 144-4. Control circuits 144 will be described below.

In embodiments, the source and the body of high voltage transistor 127 are coupled, enabling high voltage transistor 127 to operate as a diode emulator. Such embodiments eliminate the need of extra circuitry to bias the body diode of high voltage transistor 127 and also do not ground the body of high voltage transistor 127. Furthermore, since high voltage transistor 127 is embedded in N-isolation layer 201, it can operate at high floating voltages, for example, at voltages up to the breakdown voltage of N-isolation layer 201, which can be up to 30-35V. The breakdown voltage of N-isolation layers is typically 5-10V larger than that of P-isolation layers. Therefore, circuits with an N-isolation layer are more suitable to accommodate a VBAT voltage in the region of about 24V, which is typical in consumer electronics applications. The ability of high voltage transistor 127 to float up to high voltages allows high voltage transistor 127 to drive and control high side power MOSFET M1, even if the voltage VBAT of the power supply rises to 25-30V.

Additional aspects of the invention include that high voltage transistor 127, acting as the equivalent of a bootstrap diode, is integrated with the rest of circuit driver 100, thus reducing the number of external parts and the associated cost. For example, in multiphase drivers for DC-to-DC converters, typically three or four driver circuits are used. By integrating high voltage transistor 127, the complete system cost goes down by the cost of three or four external high voltage bootstrap diodes.

Further, integrated high voltage transistor 127 eliminates the need for additional complicated circuitry, which is necessary for circuit drivers using N-channel LDMOS bootstrap transistors. It is also easier to fabricate circuit driver 100, than drivers using high voltage JFET structures, because the fabrication of JFET structures introduces considerable process complications. Circuit driver 100, according to embodiments of the present invention, utilizes an integrated high voltage transistor 127, which can be fabricated with the same mask and with simultaneous process steps as the ones already used for the rest of the driver circuitry.

Embodiments of circuit driver 100 include an Under Voltage LockOut (UVLO) block 188, coupled to controller 144. One function of UVLO block 188 is to prevent driver pulses by high side driver cell 111 and low side driver cell 113, if either the VDD or VCC voltage sinks below some pre-specified limits. Such a situation may arise during a power-up or power-down sequence. Some embodiments include an Output Disable (OD#) input terminal. A logical low signal at OD# input prevents circuit driver 100 from outputting drive signals to power MOSFETs M1 and M2 through driver cells 111 and 113. Such an OD# signal can be provided by a controller of circuit driver 100. Some embodiments include a pulse-width-modulated (PWM) input, coupled from a controller into circuit driver 100. A logical high level of the PWM input controls high side driver cell 111 to turn on high side power MOSFET M1 and to turn off low side power MOSFET M2. A logical low level of the PWM input has the opposite effect.

Figure 2:
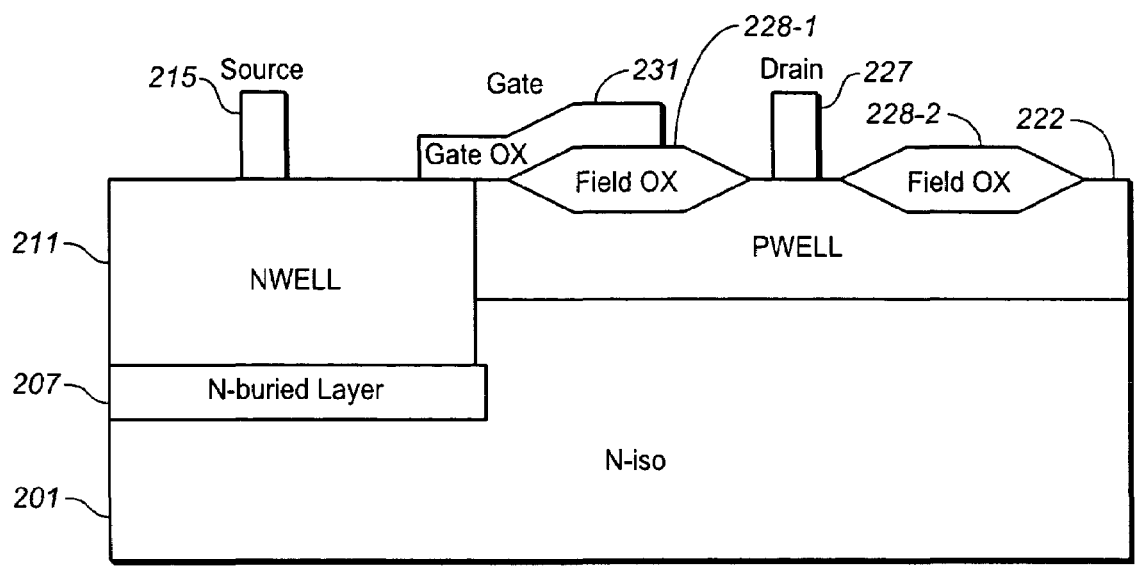
FIG. 2 is a high voltage transistor according to an embodiment of the invention.

FIG. 2 illustrates high voltage transistor 127 in more detail. High voltage transistor 127 includes an N-isolation layer 201, an N-buried layer 207, partially overlying N-isolation layer 201, an N-well 211, partially overlying N-buried layer 207 and a source 215, formed on N-well 211. Further, high voltage transistor 127 includes a P-well 222, partially overlying N-isolation layer 201, and a drain 227, formed on P-well 222. Finally, oxide layers are formed partially overlying P-well 222. Oxide layers include field oxides 228-1 and 228-2 and gate oxide 231.

In embodiments, N-well 211 and P-well 222 are formed in each other's proximity so that they essentially form a P-N junction. This design allows the use of high voltage transistor 127 as a diode emulator. When operating as a diode emulator, high voltage transistor 127 transfers the voltage VCC to bootstrap circuit 125, VCC being reduced by a diode drop of 0.6-0.75V.

In embodiments, oxide layers 228-231 can be operated as gates. Here the application of a suitable gate voltage to oxide layers 228-231 opens a low resistance conducting channel between source 215 and drain 227, essentially shorting out the P-N junction. In these embodiments, high voltage transistor 127 transfers the VCC voltage to bootstrap circuit 125 with minimal or no reduction.

In some embodiments, the high voltage operation is facilitated by embedding controller 144 at least partially into an N-type controller-isolation layer. This N-type controller-isolation layer can be the same or can be different from N-isolation layer 201 of high voltage transistor 127. Also, controller 144 can be a separate circuit, or can be integrated with driver cells 111 and 113 or other parts of circuit driver 100.

Figure 3:
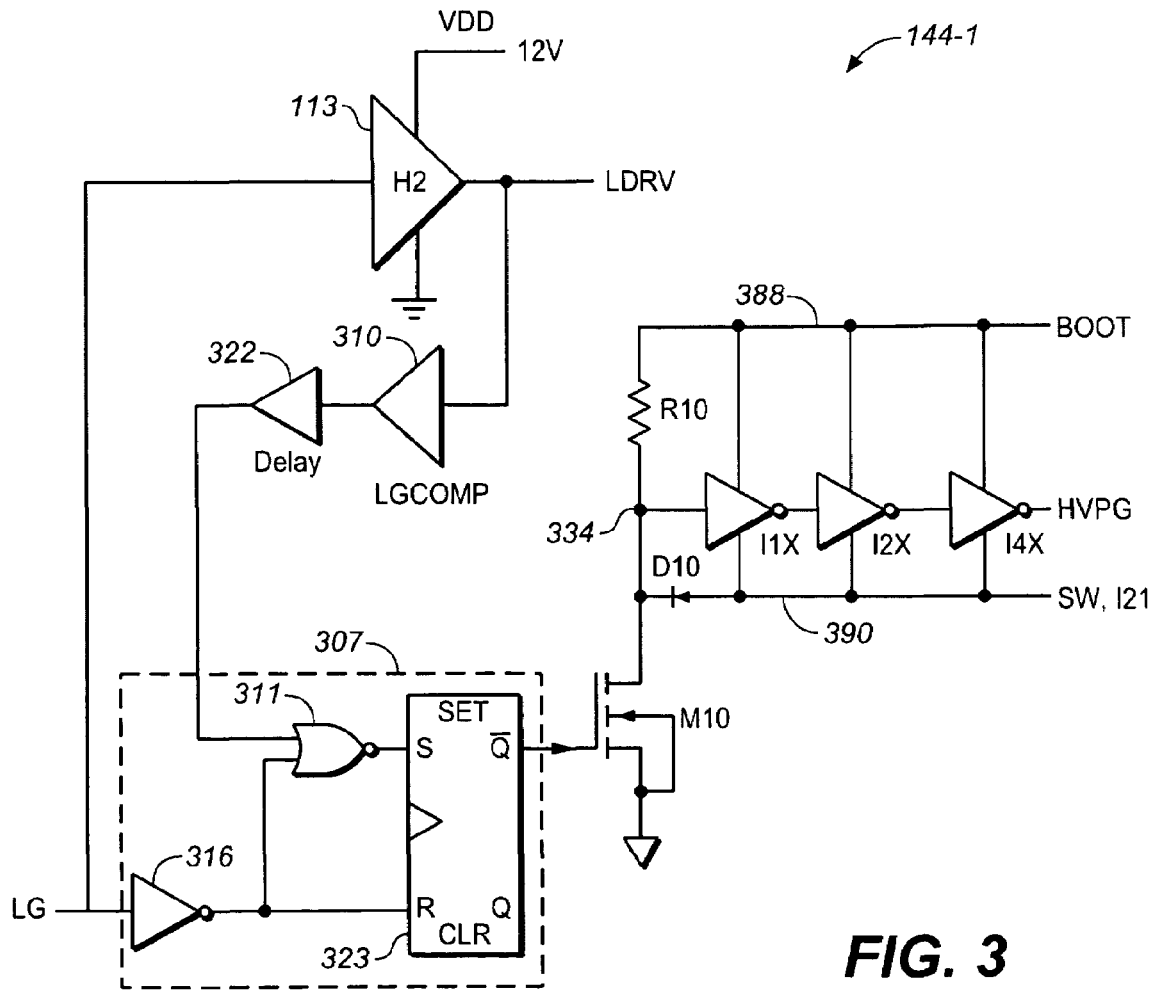
FIG. 3 is controller according to an embodiment of the invention.

FIG. 3 illustrates bootstrap controller 144-1 according to embodiments of the invention. Bootstrap controller 144-1 includes a comparator 310, which can be a Schmitt trigger. Comparator 310 is coupled in series to a delay element 322, which can be a rising edge delay circuit. The comparator—delay element circuit 310-322 is coupled into a first input terminal of a logic circuit 307. A second input terminal of logic circuit 307 is configured to receive a control signal LG. Control signal LG is an intermediate signal that is derived from other parts of controller 144 and possibly from external control signals. Control signal LG controls the operation of logic circuit 307. An output of logic circuit 307 is coupled to the high voltage transistor M10.

Logic circuit 307 can include a NOR gate 311 at its first input terminal. Delay element 322 is coupled into a first input terminal of NOR gate 311. At the second input terminal of logic circuit 307, control signal LG is coupled into an inverter 316. The output of inverter 316 is split. One of the split-outputs of inverter 316 is coupled into a second input terminal of NOR gate 311, the other split output is coupled into the Reset input of a Set-Reset (SR)-latch 323. The output of NOR gate 311 is coupled into the Set input of Set-Reset latch 323. The Qbar output of Set-Reset latch 323 controls the gate of high voltage transistor 127 through the following circuit.

The Qbar output of Set-Reset latch 323 is coupled into the gate of a high voltage MOSFET M10. Resistor R10 is coupled between the main current path of high voltage MOSFET M10 and a BOOT rail 388. A chain of inverters I1X, I2X, and I4X has its input at an inverter node 334 between resistor R10 and high voltage MOSFET M10. Inverters I1X, I2X, and I4X receive their operating voltage from the BOOT rail and are also coupled to a common rail 390. Common rail 390 is coupled to inverter node 334 between resistor R10 and MOSFET M10 through diode D10. Common rail 390 is also connected to output node 121. The output terminal of the chain of inverters, at inverter I4X, is coupled to the gate of high voltage transistor 127. Inverters I1X, I2X, and I4X include low voltage transistors, which can be embedded in N-isolation layer 201. High voltage MOSFET M10 can be a high voltage NMOS device. In embodiments, high voltage MOSFET M10 has an approximately 30V breakdown voltage relative to its drain. Diode D10 can also be a high voltage device. Other embodiments may contain additional auxiliary circuit elements, with equivalent functions.

A period of the operation of circuit driver 100 is described as follows. In the first interval of the period, circuit driver 100 turns on low side power MOSFET M2, while keeping high side power MOSFET M1 turned off, by controlling their corresponding gates. This forces output node 121 to essentially ground. In the second interval of the period, circuit driver 100 turns on high side power MOSFET M1 and turns off low side power MOSFET M2, raising output node 121 essentially to the voltage of the power supply, VBAT.

High side power MOSFET M1 is kept fully on by applying a predetermined voltage between supply-voltage terminal 126 of high side driver cell 111 and output node 121. This predetermined voltage can be, for example, 5V.

Bootstrap circuit 125, in some embodiments bootstrap capacitor C2, provides the predetermined voltage to supply-voltage terminal 126. During the first interval, output node 121 and thus the bottom plate of bootstrap capacitor C2 are shorted to essentially ground. At the same time the top plate of bootstrap capacitor C2 is coupled to bootstrap input terminal 122. Bootstrap input terminal 122 is coupled to voltage source terminal 133 through high voltage transistor 127. Therefore, an external voltage VCC, for example, the predetermined voltage (which could be 5V) is supplied from voltage source terminal 133 to bootstrap capacitor C2 through high voltage transistor 127. In the absence of a control signal on high voltage transistor 127, the voltage of bootstrap capacitor C2 is clamped to VCC minus the body diode voltage of high voltage transistor 127. A typical range of body diode voltages is 0.5-0.8V. However, if the gate of high voltage transistor 127 is pulled low by a control signal to turn high voltage transistor 127 on, then the top plate of bootstrap capacitor C2 is essentially directly connected to VCC, i.e. without a body diode voltage. In embodiments, where VCC is about 5V, turning on high voltage transistor 127 changes the voltage of bootstrap capacitor C2 from about 4.3V to about 5V. During this interval, bootstrap capacitor C2 charges up to essentially 5V and remains at that voltage as long as high side power transistor M2 and high voltage transistor 127 are on.

During the second interval, low side power MOSFET M2 is turned off and the voltage of output node 121 is allowed to rise. The top plate of bootstrap capacitor C2 is coupled to bootstrap input terminal 122, thus the voltage at bootstrap terminal 122 is now 5V above the voltage of output node 121. Thus, in this second interval bootstrap capacitor C2 is capable of providing the operating voltage for high side driver cell 111 at supply-voltage terminal 126. Even though in the second interval high side power MOSFET M1 is turned on, lifting the voltage of output node 121 towards the VBAT voltage, the voltage of supply-voltage terminal 126 remains at essentially 5V above the voltage of output node 121, thereby keeping high side power MOSFET M1 fully on.

Figure 4:
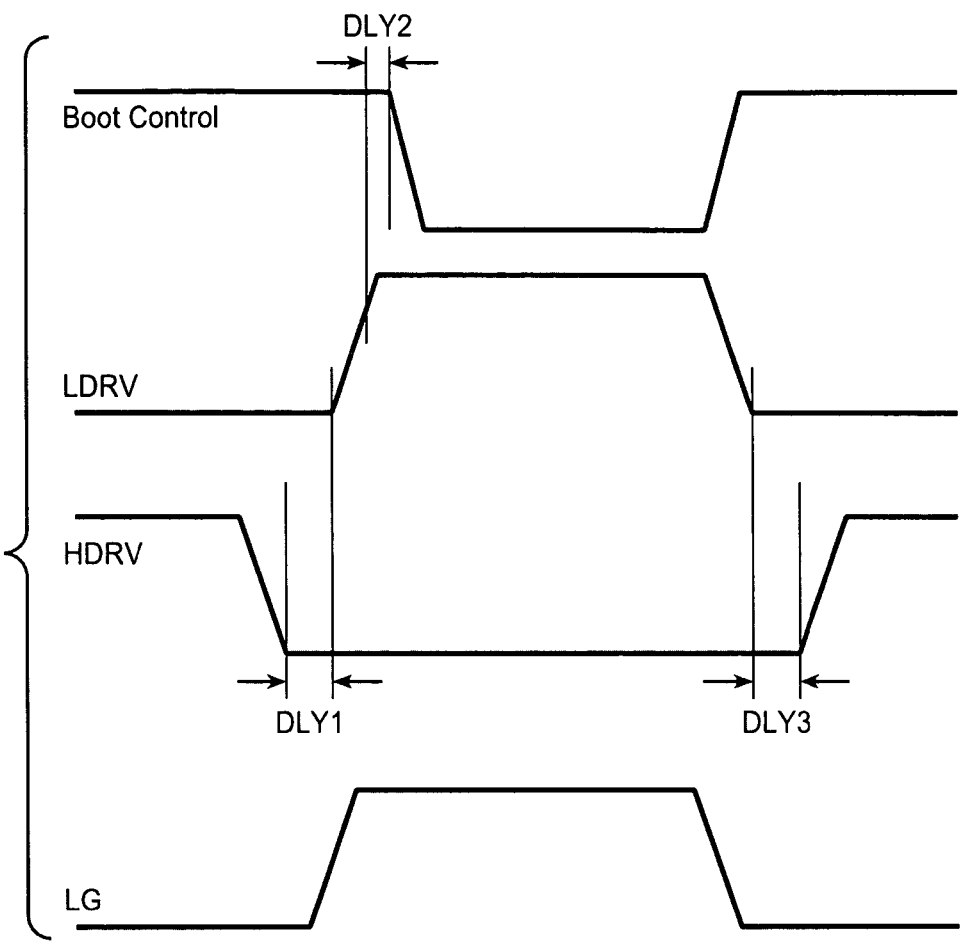
FIG. 4 is a timing diagram according to an embodiment of the invention.

FIG. 4 illustrates the timing signals, or waveforms, of circuit driver 100. In FIG. 4, "Boot control" is the gate voltage of high voltage transistor 127, LDRV is the gate voltage of low side driver cell 113, HDRV is the gate voltage of high side driver cell 111, and LG is the above discussed intermediate voltage signal, controlling logic circuit 307.

An aspect of the timing signals is that power MOSFETs M1 and M2 are not "on" simultaneously. In the timing sequences of FIG. 4 this is illustrated through the delay intervals ("dead times") DLY1 and DLY3. Signal LDRV switches power MOSFET M2 "on" a delay time DLY1 after signal HDRV switched power MOSFET M1 off. Also, signal HDRV switches power MOSFET M1 "on" a delay time DLY3 after signal LDRV switched power MOSFET M2 off. Further, the Boot control signal goes "low" with a delay DLY2 relative to the turning on of power MOSFET M2. This delay DLY2 ensures that power transistor M2 is fully "on" before high voltage transistor 127 is turned on to charge bootstrap capacitor C2. There is no equivalent delay in turning off high voltage transistor 127. High voltage transistor 127 can be turned off essentially simultaneously with the turning off of power MOSFET M2. However, power MOSFET M1 is still turned on with a delay DLY3. These delay times are controlled by control circuit 144. Delay times DLY1, DLY2, and DLY3 are typically of the order of about 20 ns to 50 ns.

In bootstrap controller 144-1, comparator 310 insures that the outputted Boot Control voltage becomes active only after the LDRV voltage of low side driver cell 113 has passed through a threshold voltage. This threshold value can be in the range of 1-10V, for example, about 4V. A further delay can be caused by delay element 322 and SR latch 323.

Additionally, the LG signal resets SR latch 323 prior to turning off of power MOSFET M2, ensuring that the bottom plate of bootstrap capacitor C2 is at ground. The described timing sequence ensures that bootstrap capacitor C2 is fully charged to VCC during the periods of circuit driver 100.

Control circuit 144 also provides a voltage level shifting as follows. Referring to FIG. 3, high voltage MOSFET M10 provides a current to resistor R10, when high voltage MOSFET M10 is turned on. The current flowing through resistor R10 pulls the voltage of inverter node 334 down towards ground. The voltage of inverter node 334 does not reach ground, however, because diode D10 clamps the voltage of inverter node 334 from going below the voltage of output node 121, thereby creating a logic low voltage at the input of inverter I1X. When high voltage transistor M10 is turned off, the voltage across resistor R10 drops to essentially zero. This pulls up the voltage of inverter node 334 to the BOOT voltage and provides a logic high voltage for inverter I1X. The output of the chain of inverters at the output of inverter I4X provides a level shifted signal HVPG that controls the gate of high voltage transistor 127.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A driver circuit for driving a first transistor and a second transistor coupled together in a half-bridge arrangement at a switching node in a power converter system, the driver circuit comprising:
    a first driver cell operable to drive the first transistor;
    a second driver cell operable to drive the second transistor;
    control circuitry coupled to the first and second driver cells, the control circuitry operable to cause the first and second driver cells to turn on and off the first and second transistors;
    a bootstrap circuit coupled between the switching node and the first driver cell, the bootstrap circuit operable to provide a high voltage for the first driver cell; and
    a high voltage PMOS transistor coupled between a first voltage source and the bootstrap circuit, wherein the high voltage PMOS transistor is integrated with the first and second driver cells, wherein the high voltage PMOS transistor is embedded in an N-isolation layer, wherein a source and a body of the high voltage PMOS transistor are electrically coupled, the high voltage PMOS transistor operable to be turned on so that the first voltage source charges the bootstrap circuit up to a voltage level of the first voltage source.

2. The driver circuit of claim 1 wherein the first transistor is a high side transistor and the second transistor is a low side transistor.

3. The driver circuit of claim 1 wherein the first driver cell is a high side driver cell and the second driver cell is a low side driver cell.

4. The driver circuit of claim 1 wherein the high voltage PMOS transistor acts as a diode emulator when it is turned off.

5. The driver circuit of claim 1 wherein the first driver cell, the second driver cell, the high voltage PMOS transistor, and the control circuitry are formed on a single integrated circuit device.

6. The driver circuit of claim 1 wherein the high voltage PMOS transistor operates at a floating voltage.

7. The driver circuit of claim 1 wherein the bootstrap circuit comprises a bootstrap capacitor.

8. A method for a driver circuit for driving a first transistor and a second transistor coupled together in a half-bridge arrangement at a switching node in a power converter system, the method comprising:
    providing a first driver cell for driving the first transistor and a second driver cell for driving the second transistor;
    providing a bootstrap circuit coupled between the switching node and the first driver cell, the bootstrap circuit operable to provide a high voltage for the first driver cell;
    providing a high voltage PMOS transistor coupled between a first voltage source and the bootstrap circuit, wherein the high voltage PMOS transistor is integrated with the first and second driver cells, wherein the high voltage PMOS transistor is embedded in an N-isolation layer, wherein a source and a body of the high voltage PMOS transistor are electrically coupled; and
    turning on the high voltage PMOS transistor so that the first voltage source charges the bootstrap circuit up to a voltage level of the first voltage source.

9. The method of claim 8 comprising turning off the high voltage PMOS transistor, wherein the high voltage PMOS transistor acts as a diode emulator when it is turned off 10. The method of claim 8 wherein the first driver cell, the second driver cell, and the high voltage PMOS transistor are formed on a single integrated circuit device.

11. A power converter system comprising:
    a first transistor and a second transistor coupled together in a half-bridge arrangement at a switching node;
    an inductor coupled at the switching node and through which a current flows to provide power at an output terminal;
    a first driver cell operable to drive the first transistor;
    a second driver cell operable to drive the second transistor;
    control circuitry coupled to the first and second driver cells, the control circuitry operable to cause the first and second driver cells to turn on and off the first and second transistors;

a bootstrap circuit coupled between the switching node and the first driver cell, the bootstrap circuit operable to provide a high voltage for the first driver cell; and a high voltage PMOS transistor coupled between a first voltage source and the bootstrap circuit, wherein the high voltage PMOS transistor is integrated with the first and second driver cells, wherein the high voltage PMOS transistor is embedded in an N-isolation layer, wherein a source and a body of the high voltage PMOS transistor are electrically coupled, the high voltage PMOS transistor operable to be turned on so that the first voltage source charges the bootstrap circuit up to a voltage level of the first voltage source.

12. The system of claim 11 wherein the first transistor is a high side transistor and the second transistor is a low side transistor.

13. The system of claim 11 wherein the first driver cell is a high side driver cell and the second driver cell is a low side driver cell.

14. The system of claim 11 wherein the high voltage PMOS transistor acts as a diode emulator when it is turned off.

15. The system of claim 11 wherein the first driver cell, the second driver cell, the high voltage PMOS transistor, and the control circuitry are formed on a single integrated circuit device.

16. The system of claim 11 wherein the high voltage PMOS transistor operates at a floating voltage.

17. The system of claim 11 wherein the bootstrap circuit comprises a bootstrap capacitor.

* * * * *